United States Patent
Kwok (10) Patent No.: US 9,680,509 B2
(45) Date of Patent: Jun. 13, 2017

(54) ERRORS AND ERASURES DECODING FROM MULTIPLE MEMORY DEVICES

(71) Applicant: Intel Corporation, Santa Clara, CA (US)

(72) Inventor: Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 14/671,960

(22) Filed: Mar. 27, 2015

(65) Prior Publication Data

US 2016/0283325 A1    Sep. 29, 2016

(51) Int. Cl.
   H03M 13/00     (2006.01)
   H03M 13/15     (2006.01)
   G06F 11/10     (2006.01)

(52) U.S. Cl.
   CPC ......... *H03M 13/617* (2013.01); *G06F 11/108* (2013.01); *H03M 13/154* (2013.01); *H03M 13/1515* (2013.01)

(58) Field of Classification Search
   CPC ........... H03M 13/1515; H03M 13/153; H03M 13/154; H03M 13/159
   See application file for complete search history.

(56) References Cited

U.S. PATENT DOCUMENTS 6,009,547 A * 12/1999 Jaquette ............... G06F 11/10
                                                710/52
6,175,945 B1 * 1/2001 Okita ..................... G06F 7/724
                                                714/784
6,854,083 B2 * 2/2005 La Rosa ............... G11C 16/10
                                                365/189.05

(Continued)

FOREIGN PATENT DOCUMENTS

WO    WO-2015/047334    4/2015

OTHER PUBLICATIONS

Huynh, Richard et al., Tsinghua University, Beijing, "A Low Power Error Detection in the Syndrome Calculator Block for Reed-Solomon Codes: RS(204,188)," Tsinghua Science and Technology 14(4): 474-477, Aug. 2009, ISSN 1007-0214 09/19.

*Primary Examiner* — Esaw Abraham
(74) *Attorney, Agent, or Firm* — Blakely, Sokoloff, Taylor & Zafman LLP (57) ABSTRACT

Embodiments are generally directed to errors and erasures decoding from multiple memory devices. An apparatus may include logic to store a portion of an error correction codeword in each of multiple memory devices, and logic to decode errors and erasures for the memory devices. The decoding of the errors and erasures includes reading the portions of the error correction codeword from a subset of the memory devices to generate a partial codeword, with the subset excluding at least one of the memory devices. The decoding of the errors and erasures further includes decoding errors and erasures of the plurality of memory devices based at least in part on the partial codeword if the errors and erasures can be decoded from the partial codeword, and, upon determining that the errors and erasures cannot be decoded from the partial codeword, then reading the one or more portions of the error correction codeword from the memory devices excluded from the first subset to generate a complete codeword.

24 Claims, 8 Drawing Sheets

(56) References Cited

U.S. PATENT DOCUMENTS

| | | | |
|---|---|---|---|
| 7,962,827 B2* | 6/2011 | Tang | H03M 5/145 714/755 |
| 8,281,227 B2* | 10/2012 | Thatcher | G06F 11/073 714/770 |
| 8,307,258 B2* | 11/2012 | Flynn | G06F 11/073 365/185.09 |
| 8,433,985 B2 | 4/2013 | Kwok et al. | |
| 8,495,460 B2* | 7/2013 | Flynn | G06F 11/073 714/758 |
| 8,819,328 B2* | 8/2014 | Lassa | G06F 9/4843 711/103 |
| 8,990,655 B2 | 3/2015 | Kwok | |
| 9,054,742 B2 | 6/2015 | Kwok | |
| 2014/0181614 A1 | 6/2014 | Kwok | |
| 2015/0188570 A1 | 7/2015 | Kwok et al. | |

\* cited by examiner

ERRORS AND ERASURES DECODING FROM MULTIPLE MEMORY DEVICES

TECHNICAL FIELD

Embodiments described herein generally relate to the field of electronic devices and, more particularly, to errors and erasures decoding from multiple memory devices.

BACKGROUND

In operation of a computing system, an error correction code (ECC) is commonly implemented into computer memory. Error correction includes Reed-Solomon (RS) error correction code, where Reed-Solomon codes are non-binary, algebraic, cyclic error correction codes.

In some implementations, an ECC codeword, such as a Reed-Solomon codeword, may be distributed across several memory devices, which may include several non-volatile memory devices. In such a manner, the loss of any particular memory device may not result in the loss of stored data as the remainder of the stored codeword may be used to correct for the unavailability of the lost memory device.

However, in normal operation accessing such a codeword stored in multiple memory devices in general requires a significant amount of power and bandwidth as obtaining the codeword requires a memory access in each of the memory devices to obtain the portion of data contained in such memory devices.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to errors and erasures decoding from multiple memory devices.

In some embodiments, a codeword such as a Reed-Solomon codeword is distributed across multiple memory devices, including, but not limited to, non-volatile memory devices. The Reed-Solomon codeword has sufficient redundancy in the form of parity symbols in order that other portions can correct the codeword even if the entire portion of the codeword from at least one memory device is lost.

In conventional operation, when all of a set of memory devices (such as, for example, non-volatile memory devices) are working properly, the entire Reed-Solomon codeword is read and decoded in order to correct any bit errors. However, there may be concerns about use of read bandwidth and read power in a computing product because constraints in power and thermal dissipation can force the product to throttle its own performance, thus slowing it down.

In certain systems where redundancy is used, such as RAID (Redundant Array of Independent Disks) in hard drives and XOR (exclusive OR) protection in solid-state drives (SSDs), the bits stored as extra redundancy for component failure protection are not read except when needed during an error condition, thus saving read bandwidth and power.

Figure 1:
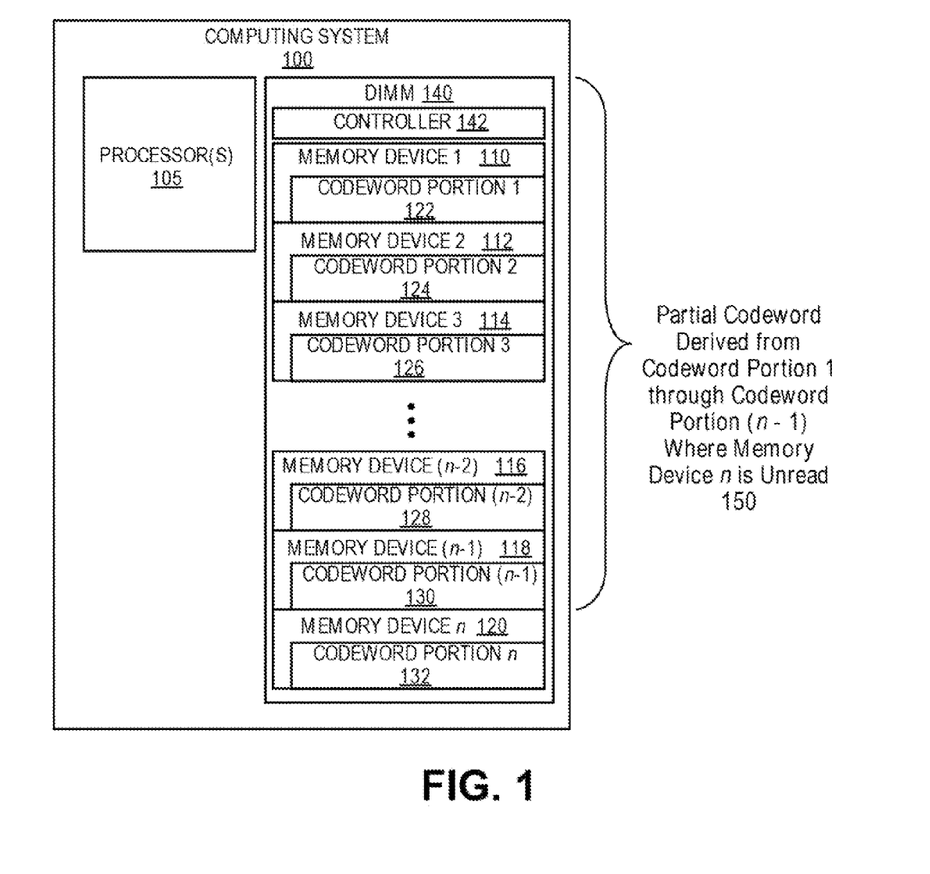
FIG. 1 is an illustration of a computing system including errors and erasures decoding based on a partial codeword according to an embodiment.

FIG. 1 is an illustration of a computing system including errors and erasures decoding based on a partial codeword according to an embodiment. In some embodiments, a computing system may include one or more processors 105 and computer memory including a plurality of memory devices. In FIG. 1 the plurality of memory devices include n memory devices illustrated as memory device 1 110, memory device 2 112, memory device 3 114, and continuing to memory device (n−2) 116, memory device (n−1) 118, and memory device n 120. In some embodiments, the memory devices 110-120 may be installed on a memory module, such as the illustrated DIMM (dual in-line memory module) 140 including a controller 142, wherein the processors 105 may interface with the memory devices 110-120 indirectly via the controller 142. Embodiments of the invention may include memory utilized in two-level memory (2LM) in which a main memory includes a first level (referred to as "near memory") that is composed of smaller, faster memory made of, for example, dynamic random access memory (DRAM); and a second level (referred to as "far memory") that is composed of larger, slower (with respect to the near memory) volatile memory (such as DRAM) or non-volatile memory storage. However, embodiments are not limited to a particular memory structure or configuration. In an alternative embodiment, errors and erasures decoding using a partial codeword may be implemented in multiple memory devices of a solid state drive, such as a part of data storage 812 illustrated in FIG. 8.

In some embodiments, the memory devices 110-120 are non-volatile memory devices, referring to memory devices that retain data when not powered. Memory devices may include memory with varying addressing characteristics, including block-based and byte-addressable memory. Non-volatile memory devices may include, but are not limited to, flash memory (including NAND flash and NOR flash, where NOR flash supports byte addressing), electrically erasable programmable read-only memory (EEPROM), ferroelectric random-access memory (FeRAM), nanowire-based non-volatile memory, byte-addressable three-dimensional (3D) crosspoint memory, phase change memory (PCM), memory that incorporates memristor technology, Magnetoresistive random-access memory (MRAM), Spin Transfer Torque (STT)-MRAM, or other types of non-volatile memory devices.

In other embodiments, the memory devices 110-120 also may be volatile memory devices such as dynamic random access memory (DRAM). In some embodiments, an implementation may be provided to save read power consumption in volatile memory, particularly in a reduced power mode or state (also referred to as a low power mode or state) such as, for example, in a battery-saving mode for a mobile electronic device (such as, for example, a laptop computer, notebook computer, or tablet computer). In a particular example, an implementation may be utilized in conjunction with a very strong ECC protection for DRAM that can protect against multiple (two or more) die failures, thus potentially avoiding the power consumption for multiple device reads.

In some embodiments, the computing system 100 includes logic to store a portion of an error correction codeword in each of the plurality of memory devices. In some embodiments, a codeword, such as a Reed-Solomon codeword, is distributed through the plurality of memory devices, such as codeword portion 1 122 stored in memory device 1 110, codeword portion 2 124 stored in memory device 2 112, codeword portion 3 126 stored in memory device 3 114, and continuing through codeword portion (n−2) 128 in memory device (n−2) 116, codeword portion (n−1) 130 in memory device (n−1) 118, and codeword portion n 132 stored in memory device n 120. Other elements of the computing system 100 may include, for example, elements illustrated in FIG. 8.

In some embodiments, a partial codeword is derived from a subset including less than all of the portions of the codeword stored in the plurality of memory devices 150, such as deriving the partial codeword from memory device 1 through memory device (n−1), and excluding the codeword portion n stored in memory device n, wherein the memory device n is not read. In some embodiments, the computing system 100 includes logic to decode errors and erasures of the plurality of memory devices based on the partial codeword. In some embodiments, an apparatus, system, or process utilizes the partial codeword in normal operation to decode errors and erasures in the plurality of memory devices without being required to read from all memory devices unless the partial codeword is insufficient for the decoding process.

In some embodiments, the logic further provides for reading the complete codeword upon determining that errors and erasures in the plurality of memory devices cannot be decoded from the partial codeword. For example, as illustrated in FIG. 1, the codeword portion n stored in memory device n is read to derive the complete codeword. In some embodiments, the logic provides for decoding errors of the plurality of memory devices based on the complete codeword.

Reed-Solomon is an error correction code (ECC) that allows for errors and erasures decoding. An erasure is a codeword symbol that is marked as being very unreliable. Properties of Reed-Solomon code include the following:

(a) The partial syndromes for A errors (where a syndrome in general is a vector generated using the commonly known operation of syndrome decoding) are defined by the following equations in the Galois field GF(q) (a Galois field being a field containing a finite number of elements):

$$S_1 = r(\alpha) = e_1\alpha^{j_1} + e_2\alpha^{j_2} + e_3\alpha^{j_3} + \ldots + e_A\alpha^{j_A}$$

$$S_2 = r(\alpha^2) = e_1\alpha^{2j_1} + e_2\alpha^{2j_2} + e_3\alpha^{2j_3} + \ldots + e_A\alpha^{2j_A}$$

$$S_3 = r(\alpha^3) = e_1\alpha^{3j_1} + e_2\alpha^{3j_2} + e_3\alpha^{3j_3} + \ldots + e_A\alpha^{3j_A}$$

$$\ldots$$

$$S_{2t} = r(\alpha^{2t}) = e_1\alpha^{2tj_1} + e_2\alpha^{2tj_2} + e_3\alpha^{2tj_3} + \ldots + e_A\alpha^{2tj_A}$$

$$S(x) = S_1 + S_2 x + S_3 x^2 + S_4 x^3 + \ldots = \Sigma_{n=1}^{\infty}(\Sigma_{i=1}^{A} e_i \alpha^{nj_i}) x^{i-1} \quad [1]$$

Where r(x) represents the received codeword in polynomial form, t is the number of correctable errors, $j_1$, $j_2$, etc., are the error locations, and $e_1$, $e_2$, etc., are the error values.

(b) The BMA (Berlekamp-Massey Algorithm) is commonly used to find the error locator polynomial, σ(x), with the calculated syndromes as the input.

$$\sigma(x) = \sigma_0 + \sigma_1 x + \sigma_2 x^2 + \sigma_3 x^3 + \ldots$$

$$\sigma(x) = \sigma_0(1+\alpha^{j_1}x)(1+\alpha^{j_2}x)(1+\alpha^{j_3}x)\ldots = \Pi_{i=1}^{A}(1+\alpha^{j_i}x) \quad [2]$$

Figure 2:
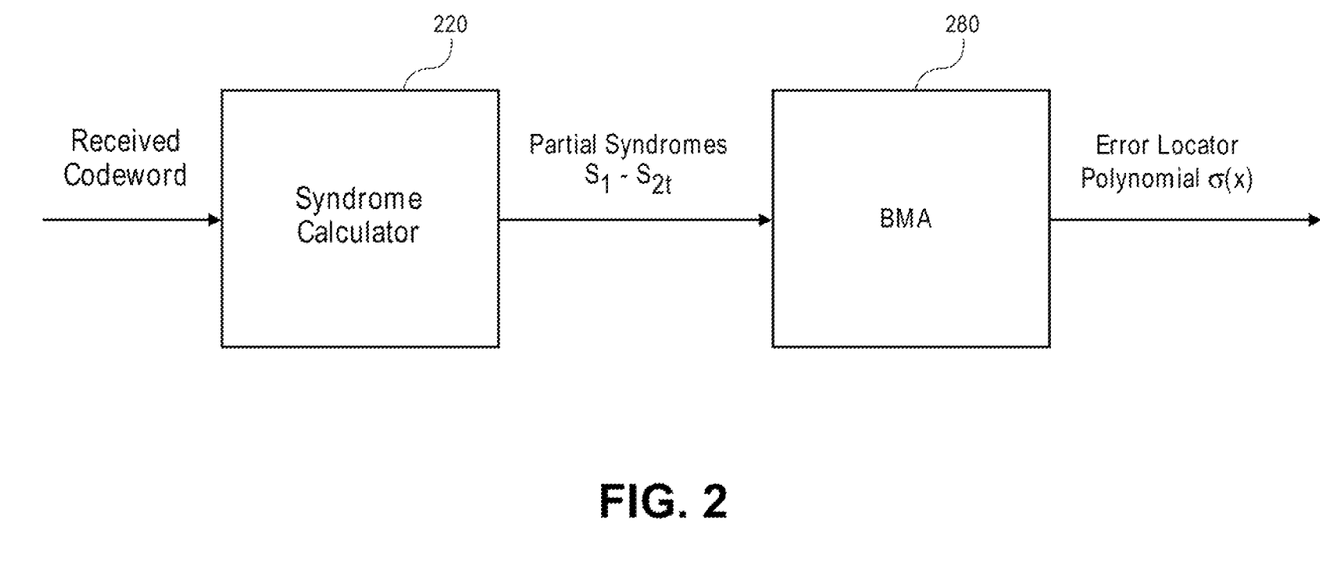
FIG. 2 is an illustration of partial syndromes and BMA (Berlekamp-Massey Algorithm) in errors decoding.

However, embodiments are not limited to BMA, and may apply an alternative algorithm to generate the error locator polynomial, FIG. 2 is an illustration of partial syndromes and BMA in error decoding. As illustrated, a received codeword is processed by the syndrome calculator 220 to generate partial syndromes $S_1$-$S_{2t}$. The partial syndromes are then processed by the BMA 280 or other algorithm to generate the error locator polynomial σ(x).

(c) The error evaluator polynomial, $Z_0(x)$, is calculated from the syndrome polynomial S(x) and the error locator polynomial σ(x) as follows:

$$Z_0(x) = [S(x)\sigma(x)] \text{ modulo } x^{2t} \quad [3]$$

(d) The error values are calculated as:

$$e_i = \frac{z_0(\alpha^{-j_i})}{\sigma'(\alpha^{-j_i})} \quad [4]$$

Note that σ'(x) is the derivative of σ(x).

(e) For erasures, an erasure locator polynomial, β(x), is generated, where $k_1$, $k_2$, etc. are the erasure locations and $f_1$, $f_2$, etc. are the erasure values.

$$\beta(x) = 1 + \beta_1 x + \beta_2 x^2 + \beta_3 x^3 + \ldots$$

$$\beta(x) = (1+\alpha^{k_1}x)(1+\alpha^{k_2}x)(1+\alpha^{k_3}x)\ldots = \Pi_{i=1}^{A}(1+\alpha^{k_i}x) \quad [5]$$

(f) The partial syndromes further include the erasures:

$$S_1 = r(a) = e_1 a^{j_1} + e_2 a^{j_2} + \ldots + e_A a^{j_A} + f_1 a^{k_1} + f_2 a^{k_2} + \ldots + f_B a^{k_B} \quad [6]$$

$$S_2 = r(a^2) =$$
$$e_1 a^{2j_1} + e_2 a^{2j_2} + \ldots + e_A a^{2j_A} + f_1 a^{2k_1} + f_2 a^{2k_2} + \ldots + f_B a^{2k_B}$$

$$S_3 = r(a^3) = e_1 a^{3j_1} + e_2 a^{3j_2} + \ldots + e_A a^{3j_A} +$$
$$f_1 a^{3k_1} + f_2 a^{3k_2} + \ldots + f_B a^{3k_B}$$

$$\ldots$$

$$S_{2t} = r(a^{2t}) = e_1 a^{2tj_1} + e_2 a^{2tj_2} +$$
$$\ldots + e_A a^{2tj_A} + f_1 a^{2tk_1} + f_2 a^{2tk_2} + \ldots + f_B a^{2tk_B}$$

$$S(x) = S_1 + S_2 x + S_3 x^2 + S_4 x^3 + \ldots =$$
$$\sum_{n=1}^{\infty}\left(\sum_{i=1}^{A} e_i a^{nj_i} + \sum_{i=1}^{B} f_i a^{nk_i}\right)x^{n-1}$$

(g) To calculate the errors, a modified syndrome polynomial, T(x), is generated:

$$T(x) = S(x)\beta(x) \quad [7]$$

$$T(x) = T_1 + T_2 x + T_3 x^2 + \ldots = \sum_{k=1}^{\infty} T_k x^{k-1}$$

$$T_{i\ldots j}(x) = T_i x^{i-1} + T_{i+1} x^i + \ldots + T_j x^{j-1} = \sum_{k=i}^{j} T_k x^{k-1}$$

$$T(x) = T_{1\ldots B}(x) + T_{B+1\ldots 2t}(x) + T_{2t+1} x^{2t} + \ldots$$

Figure 3:
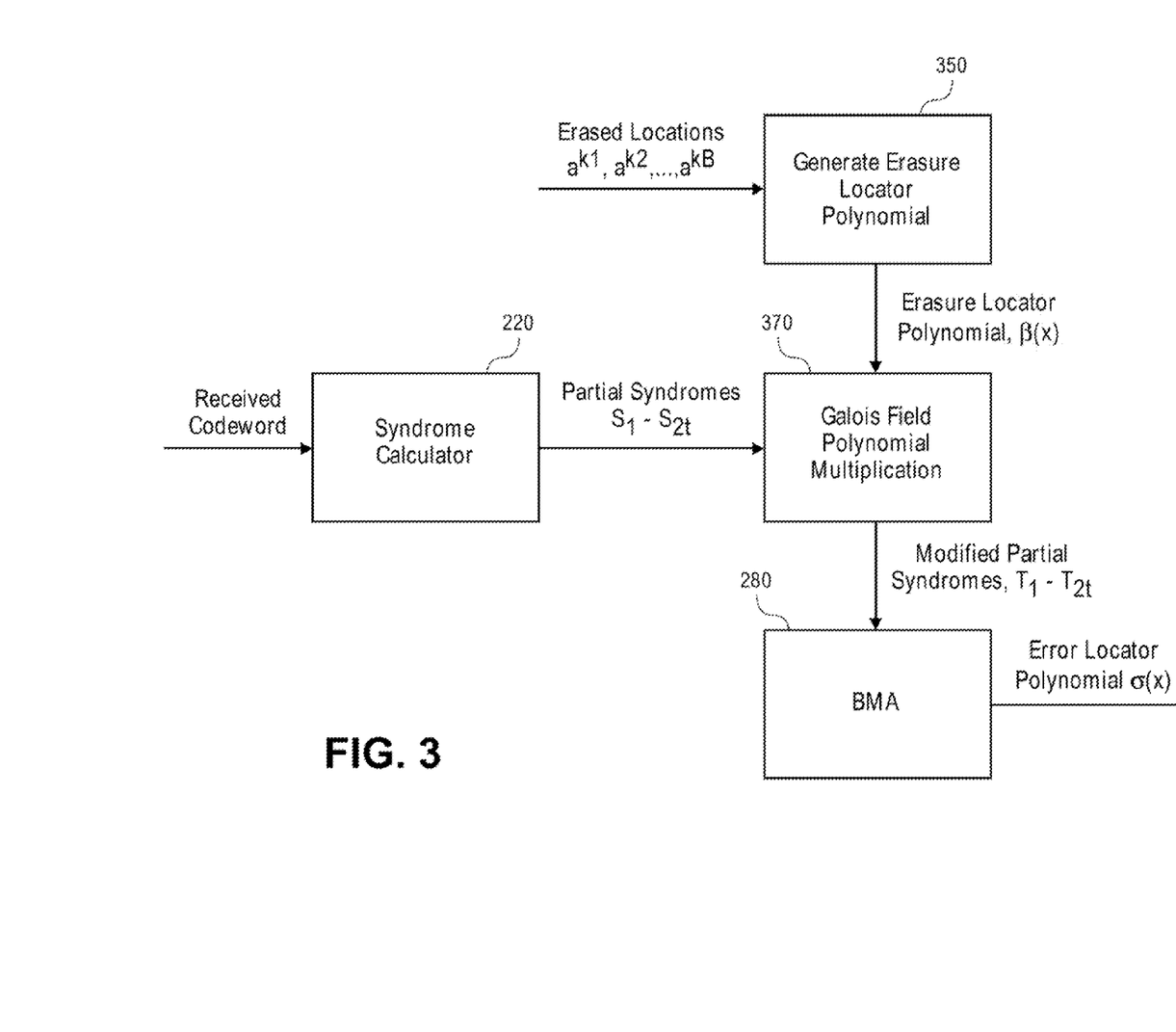
FIG. 3 is an illustration of modified partial syndromes in errors and erasures decoding according to an embodiment.

(h) A modified syndrome polynomial $T(x)$, instead of syndrome polynomial $S(x)$, is used to calculate the error locator polynomial, $\sigma(x)$, using the BMA or an alternative algorithm FIG. 3 is an illustration of modified partial syndromes in errors and erasures decoding according to an embodiment. As illustrated in FIG. 3, a received codeword is processed by the syndrome calculator 220 to generate partial syndromes $S_1$-$S_{2t}$. Further, B erased locations $a^{k1}$, $a^{k2}$, ..., $a^{kB}$ are provided to an erasure locator polynomial generator 350, resulting in the erasure polynomial $\beta(x)$. The partial syndromes and erasure location polynomial are provided to a Galois Field polynomial multiplication 370 to generate modified partial syndromes $T_1$ to $T_{2t}$. The modified partial syndromes are then processed by an algorithm to generate the error locator polynomial $\sigma(x)$, such as, for example, the illustrated BMA 280. However, embodiments are not limited to BMA. In some embodiments, an alternative algorithm to generate an error locator polynomial may be applied, wherein alternative algorithms may include, but are not limited to, the Euclidean algorithm, the Peterson-Gorenstein-Zierler algorithm, and the Welch-Berlekamp algorithm. Details regarding calculations and processing will vary depending on the specific algorithm that is implemented. The logic illustrated in FIGS. 3 and 4 may generally be referred to as an errors and erasures decoder.

(i) The error evaluator polynomial, $Z_0(x)$, is then calculated from modified syndrome polynomial $T(x)$ and error locator polynomial $\sigma(x)$.

$$Z_0(x) = [T(x)\sigma(x)] \text{ modulo } x^{2t} \quad [8]$$

(j) The errors and erasures locator polynomial, $\gamma(x)$, is then defined as:

$$\gamma(x) = \sigma(x)\beta(x) \quad [9]$$

(k) The error values $e_i$ may be calculated as:

$$e_i = \frac{Z_0(\alpha^{-j_i})}{\gamma(\alpha^{-j_i})} \quad [10]$$

(l) Further, the erasure values $f_i$ may be calculated as:

$$f_i = \frac{Z_0(\alpha^{-k_i})}{\gamma(\alpha^{-k_i})} \quad [11]$$

In some embodiments, only a portion of modified syndrome polynomial $T(x)$ is used to calculate error locator polynomial $\sigma(x)$ when there are erasures. For example, for a circumstance in which there are B erasures and up to $$\left\lfloor \frac{2t-B}{2} \right\rfloor$$

errors:

$$S_1 \text{ input to } BMA = T_{B+1} \quad [12]$$
$$S_2 \text{ input to } BMA = T_{B+2}$$
$$S_3 \text{ input to } BMA = T_{B+3}$$
$$\ldots$$
$$S_{(2t-B)/2} \text{ input to } BMA = T_{2t}$$

Figure 4:
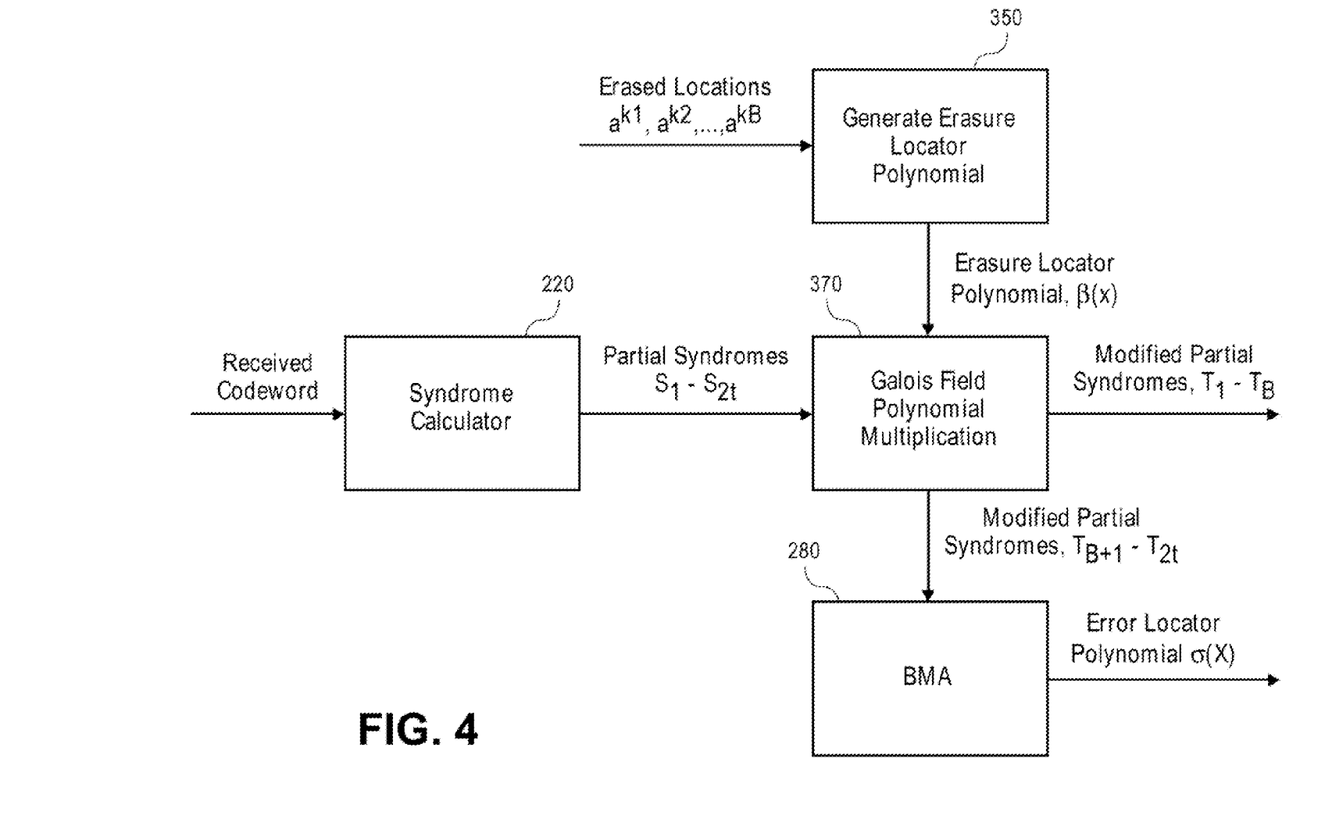
FIG. 4 illustrates modified partial syndromes in errors and erasures decoding according to an embodiment.

FIG. 4 illustrates modified partial syndromes in errors and erasures decoding according to an embodiment. FIG. 4 again illustrates the syndrome calculator 220, erasure locator polynomial generator 350, Galois field polynomial multiplication, and BMA. In contrast to FIG. 3, the BMA 280 receives modified partial syndromes $T_{B+1}$-$T_{2t}$ for the generation of error location polynomial $\sigma(x)$, and does not utilize modified partial syndromes $T_1$-$T_B$ in such operation.

In an operation, let A be a number of errors, B be a number of erasures, and t be a maximum number of symbol corrections when there are errors only and no erasures. In such operation the degree of error locator polynomial $\sigma(x)$ is A, the degree of erasure locator polynomial $\beta(x)$ is B, and $2A+B \leq 2t$. In addition, the degree of error evaluator polynomial $Z_0(x)$ is less than $A+B$.

In some embodiments, the error values $e_i$ may be calculated as:

$$e_i = \frac{Z_0(x)}{\gamma'(x)} = \frac{[T(x)\sigma(x)] \text{ modulo } x^{2t}}{\frac{d}{dx}\sigma(x)\beta(x)} \quad [13]$$

$$= \frac{[T_{1\ldots B}(x)\sigma(x)] \text{ modulo } x^{2t} + [T_{B+1\ldots 2t}(x)\sigma(x)] \text{ modulo } x^{2t}}{\sigma'(x)\beta(x) + \sigma(x)\beta'(x)}$$

For error locations $j_i$, $\sigma(\alpha^{-j_i})=0$. In addition, the degree of error evaluator polynomial $Z_0(x)$ is less than $A+B$.

$$e_i = \frac{[T_{B+1\ldots B+A}(x)\sigma(x)] \text{ modulo } x^{A+B}}{\sigma'(x)\beta(x)} \quad [14]$$

$$e_i = \frac{x^B[(T_{B+1} + T_{B+2}x + T_{B+3}x^2 + \ldots + T_{B+A}x^{A-1})\sigma(x)] \text{ modulo } x^A}{\sigma'(x)\beta(x)}$$

Further, $Z_1(x)$ may be defined as a modified error evaluator polynomial:

$$Z_1(X) = \frac{[T_{B+1\ldots B+A}(x)\sigma(x)]}{X^B} \text{ modulo } x^A \quad [15]$$

Substituting $Z_1(x)$ into the calculation for error values $e_i$, the following result is obtained:

$$e_i = \frac{x^B Z_1(x)}{\sigma(x)\beta(x)} \quad [16]$$

With regard to derivatives in Galois Fields, the following properties apply:

(1) In Galois fields, the elementary power rule works differently than in general for derivatives. For $f(x)=x^n$, instead of $f'(x)=nx^{n-1}$, the following is obtained:

$$f'(x) = \Sigma_{k=1}^n x^{n-1} \quad [17]$$

When n is even, $f'(x)=0$. When n is odd, $f'(x)=x^{n-1}$. Thus, for a polynomial:

$$f(x) = \Sigma_{k=0}^n F_k x^k \quad [18]$$

In such operation, half of the coefficients are in the derivative as well.

$$f'(x) = \sum_{k=0}^{[\frac{n-1}{2}]} F_{2k+1} x^{2k} \qquad [19]$$

(2) In Galois fields, the product rule (Leibniz rule) for differentiation holds, namely, if:

$h(x)=f(x)g(x)$ then:

$h'(x)=f'(x)g(x)+f(x)g'(x)$ [20]

In some embodiments of an apparatus, system, or process, in a normal case of a Reed-Solomon codeword that is spread through a plurality of memory devices, at least one of a plurality of memory devices is not read, and thus the reading is limited to an incomplete codeword. In some embodiments, the skipping of the at least one unread memory device operates to save read bandwidth and read power in an apparatus or system. In some embodiments, Reed-Solomon errors and erasures decoding are applied to correct errors in the incomplete codeword in this circumstance in which the data from the skipped memory device.

The skipping of at least one memory device reduces the error correction strength provided by Reed-Solomon codeword, but in the rare cases where the incomplete Reed-Solomon codeword is not correctable by utilizing the reduced codeword, the remaining data is read from the skipped memory device, and error correction is repeated with the full strength Reed-Solomon decoding using the full Reed-Solomon codeword. In some embodiments, further refinements may be implemented to simplify the operational flow in an apparatus or system.

In some embodiments, an apparatus, system, or process provides an advantage over reading an entire Reed-Solomon codeword by reducing read power in the at least one unread memory device. In a hypothetical example, if a Reed-Solomon codeword is distributed across nine memory devices, reading from only eight memory devices would generally save 11% of the read power required to read all nine memory devices, which may translate into up to 11% higher read performance for a given set of power and thermal constraints. In an operation, if the reading of the eight memory devices is not sufficient to correct all errors, the unread memory device may then be read to allow for the application of error correction with the full codeword.

In the application of Reed-Solomon codewords, reading a partial codeword provides a power savings without significant complexity, and may generally be expected to be successful 99.999% of the time in decoding errors and erasures decoding in circumstance in which one of nine memory devices is not read. In some embodiments, with the implementation of additional parity overhead, a system or apparatus may distribute the codeword across ten memory devices and read only eight of such memories, thereby saving 20% of the read power required to read all ten memory devices.

One characteristic of the use of reduced codewords in error correction is that the error detection strength is weaker when using errors and erasures decoding. However, if a memory device is read fewer times, this will also result in less read disturb on one memory device. Read disturb occurrences can cause bit errors, and reducing read disturb may reduce error rates in that one memory device, thus improving reliability and reducing the time needed to perform error corrections.

In some embodiments, for normal reads, an apparatus, system, or process operates to set the part of the Reed-Solomon codeword located in one memory device that is unread to be all '0' bits. Use of this value assists by simplifying the calculation of the syndrome.

In some embodiments, the modified Reed-Solomon syndrome, $T(x)$, may be calculated by multiplying by a fixed erasure locator polynomial, $\beta(x)$, with the regular Reed-Solomon syndrome, $S(x)$.

The erasure locator polynomial, $\beta(x)$, will be fixed because the error locations will always come from the same part of the Reed-Solomon codeword, this being the portion that is set to zeros. This permits the use of Galois field multipliers with one fixed constant factor, which thereby reduces the gate count needed to implement the multiplication logic to calculate the coefficients of the terms of modified syndrome polynomial $T(x)$. This reduced complexity also results in lower latency.

In some embodiments, a process further includes continuing decoding the Reed-Solomon codeword using the modified Reed-Solomon syndrome to find the error locations using standard algorithms such as the Berlekamp-Massey Algorithm (BMA), the Euclidean Algorithm, the Peterson-Gorenstein-Zierler algorithm, or other fast methods to solve for 1 or 2 errors. The error values can be calculated using well-known methods, but several terms will be constant, allowing the gate count needed to implement the logic to be simpler. It is not necessary to calculate the erasure values.

In some embodiments, the fixed multiplication factors that simplify the logic also provide that the latency of using errors and erasures decoding will not be substantially higher than the latency required to do regular decoding without erasures. For this reason, a performance slowdown may be avoided even when performing more complicated math.

In some embodiments, if a decode fails, an apparatus, system, or process provides for reading the remainder of the Reed-Solomon codeword from the unread memory device and decoding using the full decoding power without erasures.

In some embodiments, in order to calculate the value of the $i^{th}$ error, an apparatus, system or process operates to calculate $e_i$, wherein $x = \alpha^{-j_i}$, and $j_i$ is the location of the $i^{th}$ error. In some embodiments, the calculation of the value is:

$$e_i = \frac{x^B Z_1(x)}{\sigma(x)\beta(x)} \qquad [20]$$

In such calculation, it is not necessary to calculate any of the terms that are multiplied with $T_{1 \ldots B}(x)$. Further, it is not necessary to evaluate powers of x beyond $x^B$. In some embodiments, because B and erasure locator polynomial $\beta(x)$ are fixed, an implementation may be simplified by using a lookup table for the Error Value Adjustment.

$$ErrorValueAdjustment(x) = \frac{x^B}{\beta(x)} \qquad [21]$$

$$e_i = \frac{Z_1(x)}{\sigma(x)} ErrorValueAdjustment(x)$$

This may be compared with an equation for finding an error value without erasures, which is similar with the exception of the "Error Value Adjustment":

$$e_i = \frac{Z_0(\alpha^{-ji})}{\sigma'(\alpha^i)} ErrorValueAdjustment(x) \qquad [22]$$

It may be noted that the difference between error evaluator polynomial $Z_0$ and modified error evaluator polynomial $Z_1$ is that the terms from syndrome polynomial $S(x)$ are utilized instead of modified syndrome polynomial $T(x)$. Calculating modified error evaluator polynomial $Z_1$ instead of error evaluator polynomial $Z_0$ thus involves substituting different input terms. In this calculation, $S_1$ is substituted with $T_{B+1}$, $S_2$ is substituted with $T_{B+2}$, . . . and $S_A$ is substituted with $T_{B+A}$, where A is the degree of error locator polynomial $\sigma(x)$.

$$Z_0(x) = [S(x)\sigma(x)] \, modulo \, x^{2t} \qquad [23]$$

$$Z_1(x) = \frac{[T_{B+1\ldots B+A}(x)\sigma(x)]}{x^B} \, modulo \, x^A$$

In some embodiments, a key factor is that, with errors and erasures decoding, it is not necessary to calculate the first B terms of modified syndrome polynomial $T(x)$, i.e. $T_1$, $T_2$, . . . $T_B$, as an input into the BMA or to find the error locations. In some embodiments, such values are not calculated, unless it is desired to find the values of the erased symbols. In some embodiments, only Reed-Solomon parity symbols are erased, and are not read from memory, because it is not necessary to know the value of these bits elsewhere in the system. This substantially reduces the cost of using errors and erasures decoding.

In some embodiments, as compared to conventional errors and erasures decoding, an apparatus, system, or process provides for advantageous factors including:

(1) Erasure locator polynomial $\beta(x)$ is not computed from erasure locations;

(2) $\beta(x)$ is multiplied using fixed multipliers;

(3) The values $T_1$, $T_2$, . . . $T_B$ in modified syndrome polynomial $T(x)$ are not calculated;

4) Modified error evaluator polynomial $Z_1(x)$ has fewer terms than error evaluator polynomial $Z_0(x)$;

5) A lookup table is used for Error Value Adjustment, as opposed to logic for evaluating $x^B$ and erasure locator polynomial $\beta(x)$ for different x; and 6) Only parity symbols that are not needed outside the ECC block are erased, thus there is no need to calculate erasure values.

Avoiding the calculation of $T_1$, $T_2$, . . . $T_B$ may provide significant savings in calculation, particularly in circumstances where B is large. Avoiding the calculation of $T_1$, $T_2$, . . . $T_B$ and calculating only $T_{B+1}$, $T_{B+2}$, . . . $T_{2t}$ may cut the complexity of the Galois field polynomial multiplication by more than 50%.

In some embodiments, with the described refinements in processing, decoding of errors and erasures with a partially read codeword may be comparable in complexity and speed to regular decoding of a fully read codeword. There are some aspects of the algorithm that have reduced complexity compared to regular decoding when the maximum error correction strength is reduced and the smaller $Z_1(x)$ is used instead of $Z_0(x)$. These reductions operate to offset some of the increased complexity. In some embodiments, a main advantage is that similar decode latency even is achieved when reading a partial codeword.

Figure 5:
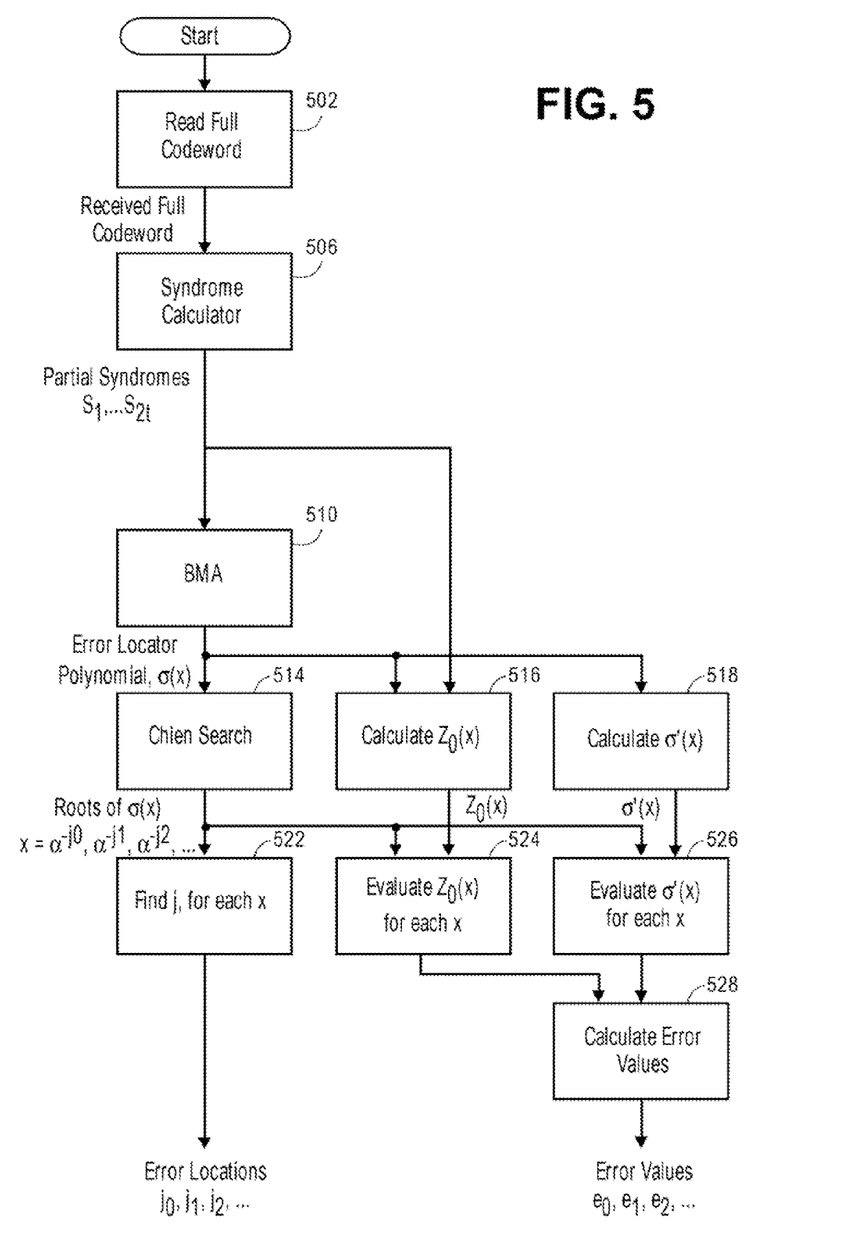
FIG. 5 is an illustration of errors and erasures decoding in which a complete codeword is read and decoded.

FIG. 5 is an illustration of errors and erasures decoding in which a complete codeword is read and decoded. As provided in FIG. 5, a complete codeword is read 502, wherein the codeword is read from a plurality of memory devices, portions of the codeword being spread among the plurality of memory devices. The received complete codeword is provided to a syndrome calculator 506, resulting in a partial syndromes $S_1$, . . . , $S_{2t}$. The partial syndromes are provided to a BMA 510, which generates an error locator polynomial $\sigma(x)$. The error locator polynomial 512 is provided to a logic for a Chien search 514 to generate the roots of $\sigma(x)$, $x=\alpha^{-j0}$, $\alpha^{-j1}$, $\alpha^{-j2}$, . . . ; to a logic for calculating the polynomial $Z_0(x)$ 516, which further includes the partial syndromes $S_1$, . . . , $S_{2t}$; and a logic for calculating the polynomial $\sigma'(x)$ 518. The roots of $\sigma(x)$, $x=\alpha^{-j0}$, $\alpha^{-j1}$, $\alpha^{-j2}$, . . . are provided to a logic for finding error location j for each x 522; provided with the polynomial $Z_0(x)$ to a logic for evaluating $Z_0(x)$ for each x 524; and provided with the polynomial $\sigma'(x)$ to a logic for evaluating $\sigma'(x)$ for each x 526. The values of $j_0$, $j_1$, $j_2$, . . . , are the error locations. The values of $Z_0(x)$ for each x and $\sigma'(x)$ for each x are provided to a logic for calculating the error values 528, the calculated error values being $e_0$, $e_1$, $e_2$, . . . .

Figure 6:
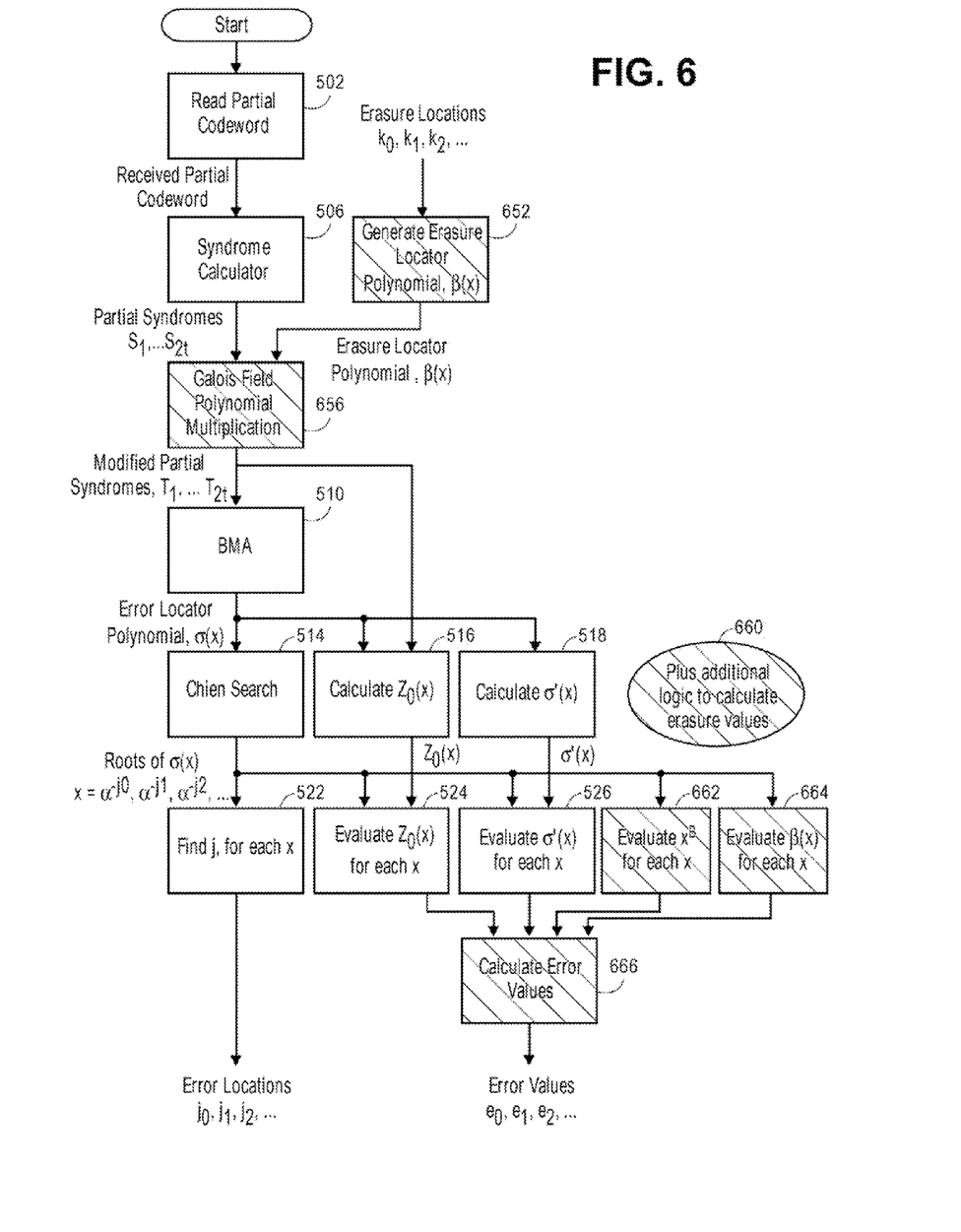
FIG. 6 is an illustration of errors and erasures decoding utilizing reading of a partial codeword according to an embodiment.

FIG. 6 is an illustration of errors and erasures decoding utilizing reading of a partial codeword according to an embodiment. Logic illustrated in FIGS. 6 and 7 may generally be referred to as an errors and erasures decoder. In some embodiments, in contrast with FIG. 5, erasure locations $k_0$, $k_1$, $k_2$, . . . are provided to a logic to generate an erasure locator polynomial 652. In some embodiments, the erasure locator polynomial $\beta(x)$ and the partial syndromes $S_1$, . . . , $S_{2t}$ are provided to a logic for Galois field polynomial multiplication 656 to generate the modified partial syndromes $T_1$, . . . , $T_{2t}$, which are then provided to the BMA 510 or other algorithm for generation of the error locator polynomial to continue the process.

In some embodiments, an apparatus, system, or process further includes additional logic to generate erasure values 660. In some embodiments, the additional logic includes the roots of $\sigma(x)$, $x=\alpha^{-j0}$, $\alpha^{-j1}$, $\alpha^{-j2}$, . . . , being further provided to a logic for evaluating $x^B$ for each x 662 and a logic for evaluating $\beta(x)$ for each x 664, with such values being applied with the values of $Z_0(x)$ for each x and $\sigma'(x)$ for each x to the logic for calculating the error values 666.

Figure 7:
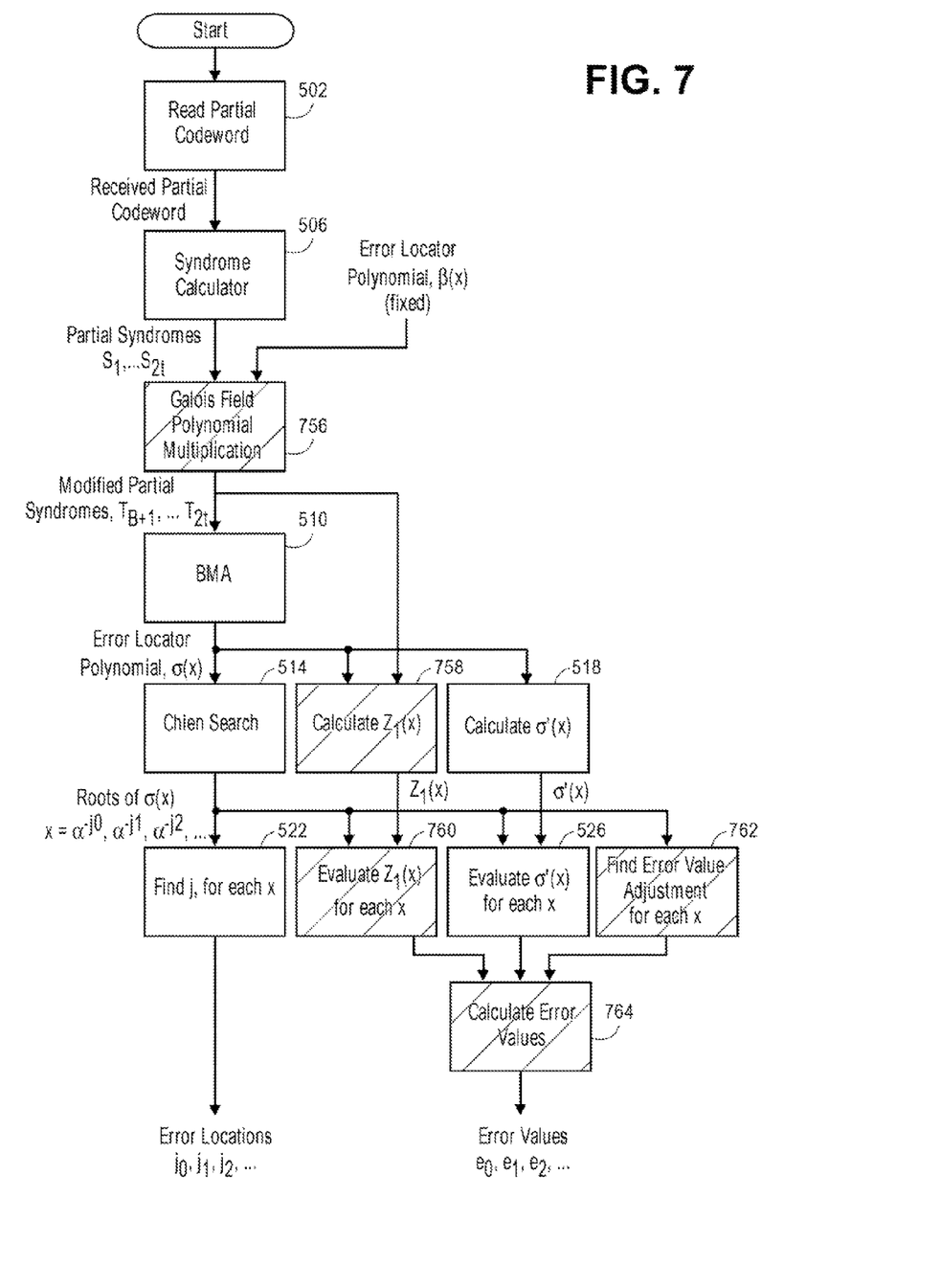
FIG. 7 is an illustration of errors and erasures decoding utilizing reading of a partial codeword as simplified by use of fixed erasure locations according to an embodiment.

FIG. 7 is an illustration of errors and erasures decoding utilizing reading of a partial codeword as simplified by use of fixed erasure locations according to an embodiment. In some embodiments, in contrast with FIG. 5, a fixed erasure locator polynomial $\beta(x)$ is provided with the partial syndromes $S_1$, . . . , $S_{2t}$ to Galois field polynomial multiplication 756 to generate the modified partial syndromes $T_1$, . . . , $T_{2t}$, which are then provided to the BMA 510 or other algorithm for generation of the error locator polynomial to continue the calculation process. In some embodiments, the modified partial syndromes $T_{B+1}$, . . . , $T_{2t}$ and error locator polynomial $\sigma(x)$ are provided to logic 758 to calculate the polynomial $Z_1(x)$ (in contrast with the calculation of $Z_0(x)$ in FIG. 5).

In some embodiments, the polynomial $Z_1(x)$ is provided with the roots of $\sigma(x)$, $x=\alpha^{-j0}$, $\alpha^{-j1}$, $\alpha^{-j2}$, . . . to a logic for evaluation of $Z_1(x)$ for each x 760. In some embodiments, roots of $\sigma(x)$, $x=\alpha^{-j0}$, $\alpha^{-j1}$, $\alpha^{-j2}$, . . . 520 are further provided to a logic for finding an error value adjustment for each x 762.

In some embodiments, the value of $Z_1(x)$ for each x and error value adjustment for each x are applied with the value of $\sigma'(x)$ for each x to the logic for calculating the error values 764, the calculated error values being $e_0, e_1, e_2, \ldots$.

Figure 8:
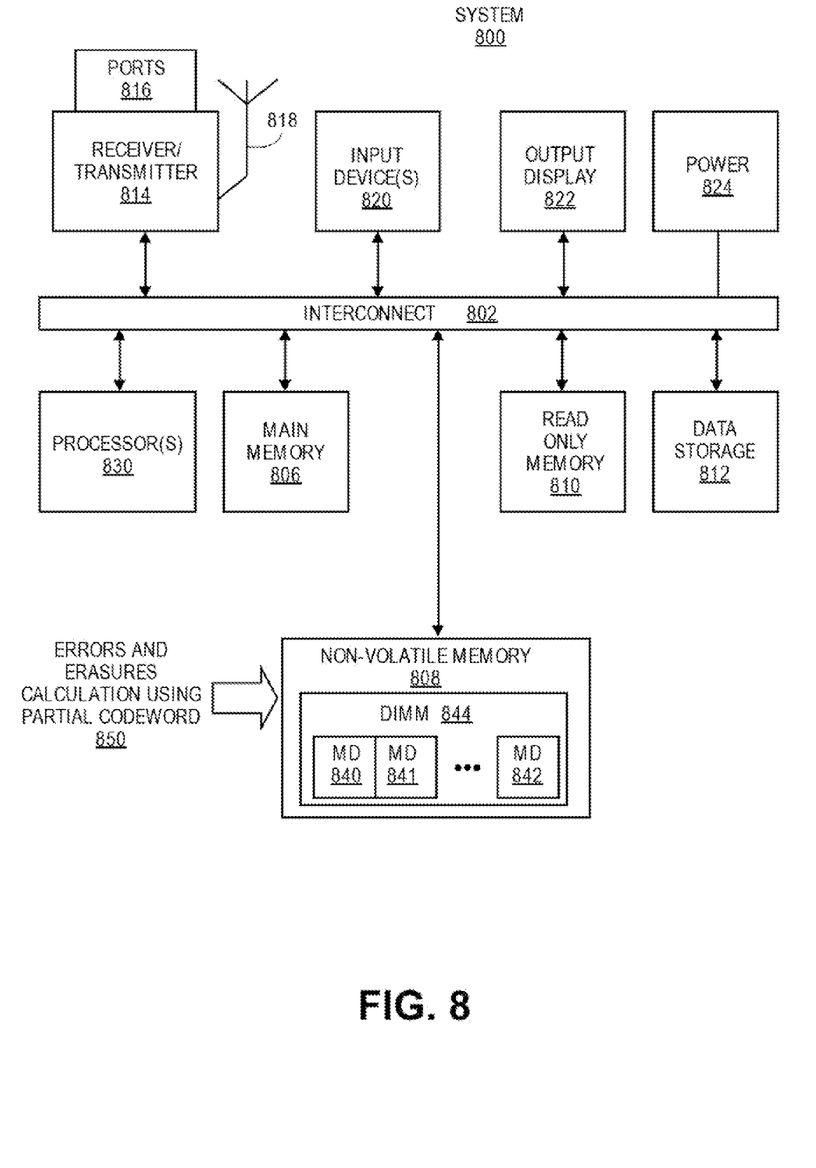
FIG. 8 is an illustration of an embodiment of an electronic apparatus or system including application of a partial codeword for errors and erasures decoding.

FIG. 8 is an illustration of an embodiment of an electronic apparatus or system including application of a partial codeword for errors and erasures decoding. In this illustration, certain standard and well-known components that are not germane to the present description are not shown. Elements shown as separate elements may be combined, including, for example, an SoC (System on Chip) combining multiple elements on a single chip. The apparatus or system (referred to generally as a system 800) may include, but is not limited to, a computing system.

In some embodiments, the system 800 may include a processing means such as one or more processors 830 coupled to an interconnect 802 for processing information. The processors 830 may comprise one or more physical processors and one or more logical processors. In some embodiments, the processors 830 may include one or more general-purpose processors or special-purpose processors.

The interconnect 802 is a communication means for transmission of data. The interconnect 802 is illustrated as a single interconnect for simplicity, but may represent multiple different interconnects or buses and the component connections to such interconnects may vary. The interconnect 802 shown in FIG. 8 is an abstraction that represents any one or more separate physical buses, point-to-point connections, or both connected by appropriate bridges, adapters, or controllers.

In some embodiments, the system 800 may include one or more non-volatile memory elements 808, including, for example, flash memory, for the storage of certain elements. In some embodiments, the non-volatile memory includes multiple memory devices illustrated as memory devices (MD) 840, 841, and continuing through 842, wherein the memory devices may be included in a module, such as DIMM 844. DIMM 844 may include a separate controller such as the controller 142 illustrated in FIG. 1. However, embodiments are not limited to a particular memory structure. In other embodiments, a controller for the memory may be located within the one or more processors 830. In some embodiments, each of the memory devices 840-842 includes a portion of a codeword. In some embodiments, the system 800 provides for errors and erasures decoding using a partial codeword 850, wherein the partial codeword is generated by reading the portions of the codeword from less than all of the memory devices 840-842. In some embodiments, the system further provides for reading a complete codeword from the memory devices 840-842 upon determining that the partial codeword is insufficient to provide for errors and erasures decoding for the memory devices. While FIG. 8 illustrates a particular implementation in which errors and erasures decoding using a partial codeword 850 is applied to non-volatile memory 808, embodiments are not limited to the particular illustrated implementation, and may include the errors and erasures decoding 850 applied to different types of memory.

In some embodiments, the apparatus 800 further comprises dynamic random access memory (DRAM) or other dynamic storage device or element as a main memory 806 for storing information and instructions to be executed by the processors 830. In some embodiments, an implementation may include the storage of a portion of a codeword in each of a plurality of volatile memory devices, such as DRAM, to provide for errors and erasures decoding using a partial codeword 850, wherein the partial codeword is generated by reading the portions of the codeword from less than all of such volatile memory devices.

The system 800 also may comprise a read only memory (ROM) 810 or other static storage device for storing static information and instructions for the processors 830, and data storage 812, such as a solid state drive, for the storage of data. In some embodiments, the system 800 may implement errors and erasures decoding in a plurality of memory devices within the solid state drive 812 using a partial codeword 850, wherein the codeword is generated by reading the portions of the codeword from less than all of the memory devices of the solid state drive. In some embodiments, a separate controller (not illustrated in FIG. 8) may interface with the memory devices. In some embodiments, errors and erasures decoding may be performed by an errors and erasures decoder, such as illustrated in FIGS. 3, 4, 6, and 7.

In some embodiments, the system 800 includes one or more transmitters or receivers 814 coupled to the interconnect 802. In some embodiments, the system 800 may include one or more antennae 818, such as dipole or monopole antennae, for the transmission and reception of data via wireless communication, and one or more ports 816 for the transmission and reception of data via wired communications.

In some embodiments, system 800 includes one or more input devices 820 for the input of data, including hard and soft buttons, a joy stick, a mouse or other pointing device, voice command system, or gesture recognition system.

In some embodiments, the system 800 includes an output display 822, where the display 822 may include a liquid crystal display (LCD) or any other display technology, for displaying information or content to a user. In some environments, the display 822 may include a touch-screen that is also utilized as at least a part of an input device 822.

The system 800 may also comprise a battery or other power source 824, which may include a solar cell, a fuel cell, a charged capacitor, near field inductive coupling, or other system or device for providing or generating power in the apparatus 800. The power provided by the power source 824 may be distributed as required to elements of the system 800.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes:

In some embodiments, an apparatus includes a plurality of memory devices; logic to store a portion of an error correction codeword in each of the plurality of memory devices; and logic to decode errors and erasures of the plurality of memory devices, wherein the decoding of the errors and erasures includes reading the portions of the error correction codeword from a first subset of the plurality of memory devices to generate a partial codeword, the first subset excluding at least one of the plurality of memory devices, decoding errors and erasures of the plurality of memory devices based at least in part on the partial codeword if the errors and erasures can be decoded from the partial codeword, and, upon determining that the errors and erasures cannot be decoded from the partial codeword, then reading the one or more portions of the error correction codeword from the at least one memory devices excluded from the first subset to generate a complete codeword.

In some embodiments, the codeword is a Reed-Solomon codeword.

In some embodiments, the apparatus further includes logic to decode errors and erasures of the plurality of memory devices based at least in part on the complete codeword.

In some embodiments, the plurality of memory devices are non-volatile memory devices.

In some embodiments, the plurality of memory devices are included in a memory module. In some embodiments, the plurality of memory devices are included in a solid state memory.

In some embodiments, the plurality of memory devices are volatile memory devices.

In some embodiments, the logic to decode errors and erasures of the plurality of memory devices includes logic to perform a Galois field polynomial multiplication of: partial syndromes generated using the partial codeword; and an erasure locator polynomial, the multiplication to generate a set of modified partial syndromes.

In some embodiments, the logic to decode errors and erasures of the plurality of memory devices includes logic to generate an error locator polynomial based on the modified partial syndromes.

In some embodiments, the generation of the error locator polynomial is based on a first subset of the modified partial syndromes and excludes a second subset of the modified partial syndromes.

In some embodiments, the logic to decode errors and erasures of the plurality of memory devices includes logic to generate an erasure locator polynomial based on erasure locations.

In some embodiments, the erasure locator polynomial is a fixed polynomial.

In some embodiments, the logic to perform the Galois field polynomial multiplication excludes generation of a subset of the modified partial syndromes.

In some embodiments, the logic to decode errors and erasures of the plurality of memory devices includes logic to evaluate an erasure locator polynomial based on roots of the error locator polynomial.

In some embodiments, the logic to decode errors and erasures of the plurality of memory devices includes logic to evaluate an error value adjustment based on roots of the error locator polynomial.

In some embodiments, a method includes storing a portion of an error correction codeword in each of a plurality of memory devices; and decoding errors and erasures of the plurality of memory devices, wherein the decoding of the errors and erasures includes reading the portions of the error correction codeword from a first subset of the plurality of memory devices to generate a partial codeword, the first subset excluding at least one of the plurality of memory devices, decoding errors and erasures of the plurality of memory devices based at least in part on the partial codeword if the partial codeword is sufficient to decode the errors and erasures of the plurality of memory devices, and, upon determining that the partial codeword is insufficient to decode the errors and erasures of the plurality of memory devices, then reading the one or more portions of the error correction codeword from the at least one memory devices excluded from the first subset to generate a complete codeword.

In some embodiments, the codeword is a Reed-Solomon codeword.

In some embodiments, the method further includes decoding errors of the plurality of memory devices based at least in part on the complete codeword.

In some embodiments, the method further includes performing a Galois field polynomial multiplication of partial syndromes generated using the partial codeword; and an erasure locator polynomial, the multiplication to generate a set of modified partial syndromes.

In some embodiments, the decoding of errors and erasures of the plurality of memory devices includes generating an error locator polynomial based on the modified partial syndromes, In some embodiments, the generation of the error locator polynomial is based on a first subset of the modified partial syndromes and excludes a second subset of the modified partial syndromes.

In some embodiments, the decoding of errors and erasures of the plurality of memory devices includes generating an erasure locator polynomial based on erasure locations.

In some embodiments, the erasure locator polynomial is a fixed polynomial.

In some embodiments, performing the Galois field polynomial multiplication excludes generation of a subset of the modified partial syndromes.

In some embodiments, the decoding of errors and erasures of the plurality of memory devices includes logic to evaluate an erasure locator polynomial based on roots of the error locator polynomial.

In some embodiments, the decoding of errors and erasures of the plurality of memory devices includes evaluate an error value adjustment based on roots of the error locator polynomial.

In some embodiments, the plurality of memory devices are non-volatile memory devices.

In some embodiments, the plurality of memory devices are volatile memory devices. In some embodiments, the decoding of the errors and erasures based at least in part on the partial codeword is applied to the volatile memory devices in a reduced power mode or state.

In some embodiments, a computing system includes a processor; a main memory including dynamic random access memory (DRAM); a plurality of non-volatile memory devices to store data for the computing system; logic to store a portion of a Reed-Solomon error correction codeword in each of the plurality of non-volatile memory devices; and an errors and erasures decoder for the plurality of non-volatile memory devices, wherein the decoding of the errors and erasures by the errors and erasures decoder includes: reading the portions of the error correction codeword from a first subset of the plurality of non-volatile memory devices to generate a partial codeword, the first subset excluding at least one of the plurality of non-volatile memory devices, and decoding errors and erasures of the plurality of non-volatile memory devices based at least in part on the partial codeword if the partial codeword is sufficient to decode the errors and erasures of the plurality of memory devices, and, upon determining that the partial codeword is insufficient to decode the errors and erasures of the plurality of memory devices, then reading the one or more portions of the error correction codeword from the at least one memory devices excluded from the first subset to generate a complete codeword.

In some embodiments, the errors and erasures decoder includes logic to: decode errors of the plurality of non-volatile memory devices based at least in part on the complete codeword.

In some embodiments, the plurality of non-volatile memory devices are included in a dual in-line memory module (DIMM).

In some embodiments, the plurality of non-volatile memory devices are included in a solid state drive.

In some embodiments, the errors and erasures decoder includes logic to perform a Galois field polynomial multiplication of: partial syndromes generated using the partial codeword; and an erasure locator polynomial, the multiplication to generate a set of modified partial syndromes.

In some embodiments, a non-transitory computer-readable storage medium having stored thereon data representing sequences of instructions that, when executed by a processor, cause the processor to perform operations including, storing a portion of an error correction codeword in each of a plurality of memory devices; and decoding errors and erasures of the plurality of memory devices, wherein the decoding of the errors and erasures includes: reading the portions of the error correction codeword from a first subset of the plurality of memory devices to generate a partial codeword, the first subset excluding at least one of the plurality of memory devices, and decoding errors and erasures of the plurality of memory devices based at least in part on the partial codeword.

In some embodiments, the codeword is a Reed-Solomon codeword.

In some embodiments, the medium further includes instructions that, when executed by the processor, cause the processor to perform operations including: determining that errors and erasures for the plurality of memory devices cannot be decoded from the partial codeword; reading the one or more portions of the error correction codeword from the at least one memory device excluded from the first subset to generate a complete codeword; and decoding errors and erasures of the plurality of memory devices based at least in part on the complete codeword.

In some embodiments, an apparatus includes means for storing a portion of an error correction codeword in each of a plurality of memory devices; and means for decoding errors and erasures of the plurality of memory devices, wherein the measure for decoding of the errors and erasures includes: means for reading the portions of the error correction codeword from a first subset of the plurality of memory devices to generate a partial codeword, the first subset excluding at least one of the plurality of memory devices, means for decoding errors and erasures of the plurality of memory devices based at least in part on the partial codeword if the partial codeword is sufficient to decode the errors and erasures of the plurality of memory devices, and means for reading the one or more portions of the error correction codeword from the at least one memory devices excluded from the first subset to generate a complete codeword upon determining that the partial codeword is insufficient to decode the errors and erasures of the plurality of memory devices.

In some embodiments, the codeword is a Reed-Solomon codeword.

In some embodiments, the apparatus further includes means for decoding errors of the plurality of memory devices based at least in part on the complete codeword.

What is claimed is:

1. An apparatus including a plurality of memory devices, the apparatus comprising:
a processor to store a portion of an error correction codeword in each of the plurality of memory devices; and
an errors and erasures decoder to decode errors and erasures of the plurality of memory devices, wherein the errors and erasures decoder is operable to:
read the portions of the error correction codeword from a first subset of the plurality of memory devices to generate a partial codeword, the first subset excluding at least one of the plurality of memory devices,
decode errors and erasures of the plurality of memory devices based at least in part on the partial codeword upon the errors and erasures decoder determining that the partial codeword is sufficient to decode the errors and erasures, and
read the one or more portions of the error correction codeword from the at least one memory devices excluded from the first subset to generate a complete codeword upon the errors and erasures decoder determining that the partial codeword is insufficient to decode the errors and erasures.

2. The apparatus of claim 1, wherein the codeword is a Reed-Solomon codeword.

3. The apparatus of claim 1, wherein the errors and erasures decoder is further operable to:
decode errors of the plurality of memory devices based at least in part on the complete codeword.

4. The apparatus of claim 1, wherein the plurality of memory devices are non-volatile memory devices.

5. The apparatus of claim 1, wherein the plurality of memory devices are included in:
a memory module; or
a solid state memory.

6. The apparatus of claim 1, wherein the errors and erasures decoder is further operable to perform a Galois field polynomial multiplication of:
partial syndromes generated using the partial codeword; and
an erasure locator polynomial, the multiplication to generate a set of modified partial syndromes.

7. The apparatus of claim 6, wherein the errors and erasures decoder is further operable to generate an error locator polynomial based on the modified partial syndromes.

8. The apparatus of claim 7, wherein the generation of the error locator polynomial is based on a first subset of the modified partial syndromes and excludes a second subset of the modified partial syndromes.

9. The apparatus of claim 7, wherein the errors and erasures decoder is further operable to generate an erasure locator polynomial based on erasure locations.

10. The apparatus of claim 6, wherein the erasure locator polynomial is a fixed polynomial.

11. The apparatus of claim 6, wherein the Galois field polynomial multiplication excludes generation of a subset of the modified partial syndromes.

12. The apparatus of claim 6, wherein the errors and erasures decoder is further operable to evaluate one or more of an erasure locator polynomial and an error value adjustment based on roots of the error locator polynomial.

13. A method comprising:
storing, by a processor of an apparatus, a portion of an error correction codeword in each of a plurality of memory devices; and
decoding, by an errors and erasures decoder of the apparatus, errors and erasures of the plurality of memory devices, wherein the decoding of the errors and erasures by the errors and erasures decoder includes:
reading the portions of the error correction codeword from a first subset of the plurality of memory devices to generate a partial codeword, the first subset excluding at least one of the plurality of memory devices,
decoding errors and erasures of the plurality of memory devices based at least in part on the partial codeword upon the errors and erasures decoder determining that the partial codeword is sufficient to decode the errors and erasures of the plurality of memory devices, and
upon the errors and erasures decoder determining that the partial codeword is insufficient to decode the errors and erasures of the plurality of memory devices, then reading the one or more portions of the error correction codeword from the at least one memory devices excluded from the first subset to generate a complete codeword and decoding the errors and erasures of the plurality of memory devices based at least in part on the complete codeword.

14. The method of claim 13, further comprising performing, by the errors and erasures decoder, a Galois field polynomial multiplication of:
partial syndromes generated using the partial codeword; and
an erasure locator polynomial, the multiplication to generate a set of modified partial syndromes.

15. The method of claim 14, wherein the decoding of errors and erasures of the plurality of memory devices include generating, by the errors and erasures decoder, an error locator polynomial based on the modified partial syndromes.

16. The method of claim 15, wherein the generation of the error locator polynomial is based on a first subset of the modified partial syndromes and excludes a second subset of the modified partial syndromes.

17. The method of claim 15, wherein the decoding of errors and erasures of the plurality of memory devices includes generating, by the errors and erasures decoder, an erasure locator polynomial based on erasure locations.

18. The method of claim 14, wherein the erasure locator polynomial is a fixed polynomial.

19. The method of claim 14, wherein performing the Galois field polynomial multiplication excludes generation of a subset of the modified partial syndromes.

20. The method of claim 14, wherein the decoding of errors and erasures of the plurality of memory devices includes one or more of the errors and erasures decoder:
evaluating an erasure locator polynomial; or
evaluating an error value adjustment based on roots of the error locator polynomial.

21. A computing system comprising:
a processor;
a main memory including dynamic random access memory (DRAM);
a plurality of non-volatile memory devices to store data for the computing system, the processor to store a portion of a Reed-Solomon error correction codeword in each of the plurality of non-volatile memory devices; and an errors and erasures decoder for the plurality of non-volatile memory devices, the errors and erasures decoder is operable to:
  read the portions of the error correction codeword from a first subset of the plurality of non-volatile memory devices to generate a partial codeword, the first subset excluding at least one of the plurality of non-volatile memory devices,
  decode errors and erasures of the plurality of non-volatile memory devices based at least in part on the partial codeword upon the errors and erasures decoder determining the partial codeword is sufficient to decode the errors and erasures, and
  read the one or more portions of the error correction codeword from the at least one memory devices excluded from the first subset to generate a complete codeword upon the errors and erasures decoder determining that the partial codeword is insufficient to decode the errors and erasures.

22. The system of claim 21, wherein the errors and erasures decoder is further operable to:
  decode errors of the plurality of non-volatile memory devices based at least in part on the complete codeword.

23. The system of claim 21, wherein the plurality of non-volatile memory devices are included in a dual in-line memory module (DIMM).

24. A non-transitory computer-readable storage medium having stored thereon data representing sequences of instructions that, when executed by a processor, cause the processor to perform operations comprising:

storing, by a processor of an apparatus, a portion of an error correction codeword in each of a plurality of memory devices; and decoding, by an errors and erasures decoder of the apparatus, errors and erasures of the plurality of memory devices, wherein the decoding of the errors and erasures by the errors and erasures decoder includes:
  reading the portions of the error correction codeword from a first subset of the plurality of memory devices to generate a partial codeword, the first subset excluding at least one of the plurality of memory devices,
  decoding errors and erasures of the plurality of memory devices based at least in part on the partial codeword upon the errors and erasures decoder determining that the partial codeword is sufficient to decode the errors and erasures of the plurality of memory devices, and
  upon the errors and erasures decoder determining that the partial codeword is insufficient to decode the errors and erasures of the plurality of memory devices, then reading the one or more portions of the error correction codeword from the at least one memory devices excluded from the first subset to generate a complete codeword and decoding the errors and erasures of the plurality of memory devices based at least in part on the complete codeword.

* * * * *